(12) United States Patent
Kim et al.

(10) Patent No.: US 7,655,307 B2
(45) Date of Patent: Feb. 2, 2010

(54) RESIN COMPOSITION FOR MOLD USED IN FORMING MICROPATTERN, AND METHOD FOR FABRICATING ORGANIC MOLD THEREFROM

(75) Inventors: Tae Wan Kim, Seoul (KR); Pil Jin Yoo, Seoul (KR)

(73) Assignee: Minuta Technology Co., Ltd. (KR)

( * ) Notice: Subject to any disclaimer, the term of this patent is extended or adjusted under 35 U.S.C. 154(b) by 637 days.

(21) Appl. No.: 10/553,647

(22) PCT Filed: Apr. 14, 2004

(86) PCT No.: PCT/KR2004/000860

§ 371 (c)(1),
(2), (4) Date: Oct. 14, 2005

(87) PCT Pub. No.: WO2004/090636

PCT Pub. Date: Oct. 21, 2004

(65) Prior Publication Data

US 2006/0214326 A1    Sep. 28, 2006

(30) Foreign Application Priority Data

Apr. 14, 2003    (KR) ...................... 10-2003-0023432

(51) Int. Cl.
*B32B 27/40* (2006.01)
*B29C 39/00* (2006.01)
(52) U.S. Cl. .................... 428/423.1; 428/446; 428/421; 264/225
(58) Field of Classification Search ................ 264/225; 528/44; 428/423.1, 446, 421
See application file for complete search history.

(56) References Cited

U.S. PATENT DOCUMENTS 4,929,403 A * 5/1990 Audsley ...................... 264/446
6,071,443 A * 6/2000 Osawa et al. ............... 264/1.36
7,195,857 B2 * 3/2007 Tamura et al. ........... 430/280.1

FOREIGN PATENT DOCUMENTS

| JP | 1989-86102 | 4/1989 |
|---|---|---|
| JP | 1989-302201 | 11/1989 |
| JP | 1996-34023 | 2/1996 |
| JP | 1996-90663 | 4/1996 |
| JP | 2003-342338 | 9/2003 |
| JP | 2004-4515 | 1/2004 |
| JP | 2004-59820 | 3/2004 |
| JP | 2004-59822 | 3/2004 |

* cited by examiner

*Primary Examiner*—Thao T. Tran
(74) *Attorney, Agent, or Firm*—Baker & Hostetler, LLP

(57) ABSTRACT

A resin composition for a mold used in forming micropatterns comprises (A) 40 to 90 parts by weight of an active energy curable urethane-based oligomer having a reactive group; (B) 10 to 60 parts by weight of a monomer reactive with the urethane-based oligomer, (C) 0.01 to 200 parts by weight of a silicone or fluorine containing compound, based on 100 parts of the sum of the components (A) and (B); and (D) 0.1 to 10 parts by weight of a photoinitiator, based on 100 parts of the sum of the components (A), (B) and (C). The inventive resin composition can be easily cured by the action of an active energy ray, and the organic mold fabricated therefrom is easily lifted off from a master without irreversible adhesion or generation of defects and have excellent dimensional and chemical stabilities.

10 Claims, 4 Drawing Sheets

US 7,655,307 B2

RESIN COMPOSITION FOR MOLD USED IN FORMING MICROPATTERN, AND METHOD FOR FABRICATING ORGANIC MOLD THEREFROM

FIELD OF THE INVENTION

The present invention relates to a resin composition for a mold used in forming micropatterns, and to a method for fabricating an organic mold using same and the organic mold fabricated thereby.

BACKGROUND OF THE INVENTION

Various devices including integral circuits, semiconductors, electronic, photoelectric, display, magnetic or electromechanical devices and optical lens (e.g., prism sheet and lenticular lens sheet) involve micropatterns which have been conventionally formed by photolithography. However, the photolithography requires a complicated patterning process and a high production cost, and is not suitable for forming ultramicropatterns having a line width of below 100 nm.

Therefore, there has been recently developed a nano-imprint lithography wherein a pattern of a hard mold, e.g., a Si mold, is replicated on a thermoplastic polymer layer. This method is advantageous in fabricating a pattern having a narrow line width of about 7 nm owing to the hardness of the mold (see S. Y. Chou et al., J. Vac. Sci. Technol. B15, 2897 (1997)). However, this nano-imprint lithography has the problems that the mold is not easily lifted off from the substrate and it may break during the pressurizing procedure under a high temperature and pressure condition.

Other non-traditional lithographic methods for fabricating micropatterns include micro-contact printing (mCP), micro-molding in capillaries (MIMIC), micro-transfer molding (mTM), soft molding, and capillary force lithography (CFL) methods. These methods generally employ a mold made of an elastic polymer such as polydimethylsiloxane (PDMS), which is a silicon rubber type, but the PDMS mold has poor dimensional and chemical stabilities so that it cannot achieve a narrow pattern width of less than 500 nm.

Modified PDMS's including h-PDMS (hard PDMS) and hv-PDMS (photo-curable PDMS) have been developed to solve the problem of PDMS. However, h-PDMS still suffers from brittleness, low elongation at break, and poor conformal contact with a substrate (see Odom, Y. W. et al, *Langmuir*, 18, 5314-5320 (2002)), and hv-PDMS does not have enough modulus to replicate fine pattern below 100 nm even thouth troduced to overcome the aforementioned some limitations of conventional PDMS (see *J. Am. Chem. Soc.* 125, 4060-4061 (2003)).

SUMMARY OF THE INVENTION

Accordingly, it is an object of the present invention to provide a novel mold material having a modulus high enough for forming submicro-patterns and good chemical and dimensional stabilities which can be used for producing an organic mold that can be easily and repeatedly lifted off from a substrate without irreversible adhesion or generation of defects.

Further, it is another object of the present invention to provide a method for fabricating a mold using said material, and the mold fabricated thereby.

In accordance with one aspect of the present invention, there is provided a resin composition for a mold used in forming micropatterns, which comprises:

(A) 40 to 90 parts by weight of an active energy curable urethane-based oligomer having a reactive group selected from the group consisting of (meth)acrylate, vinylether, arylether, and a combination thereof;

(B) 10 to 60 parts by weight of a monomer (i.e., a reactive diluent) which is reactive with the urethane-based oligomer, and which has a reactive group selected from the group consisting of (meth)acrylate, vinylether, arylether, and a combination thereof;

(C) 0.01 to 200 parts by weight of a silicone or fluorine-containing compound (i.e., a functionalized additive), based on 100 parts of the sum of the components (A) and (B); and (D) 0.1 to 10 parts by weight of a photo-initiator, based on 100 parts of the sum of the components (A), (B) and (C).

In accordance with another aspect of the present invention, there is provided a method for fabricating an organic mold, which comprises coating or casting the inventive resin composition on a pattern face of a mastermold, placing a support on the resin layer, irradiating an active energy ray to the resulting laminate to preliminarily cure the resin layer, lifting off the organic mold having a reverse pattern face to that of the mastermold and integrally formed with the support from the mastermold, and completely curing the organic mold.

In accordance with a further aspect of the present invention, there is provided a method for fabricating an organic mold, which comprises coating or casting the inventive resin composition on a pattern face of a mastermold, irradiating the resin layer with an active energy ray to preliminarily cure it, pouring a UV- or heat-curable resin composition onto the cured resin layer as a backbone, heating or irradiating the resultant to completely cure the resin layer and the backbone layer, lifting off the organic mold having a reverse pattern face to that of the mastermold and integrally formed with the backbone layer from the mastermold, and completely curing the organic mold.

In accordance with a still further aspect of the present invention, there is provided an organic mold having submicro-pattens, fabricated by any one of the inventive methods.

BRIEF DESCRIPTION OF THE DRAWINGS

The above and other objects and features of the present invention will become apparent from the following description of the invention, when taken in conjunction with the accompanying drawings, which respectively show:

FIG. 2b: an electronic microscopic photograph of a pattern formed on a substrate using the mold of FIG. 2a;

FIG. 3b: an electronic microscopic photograph of a pattern formed on a substrate using the mold of FIG. 3a;

FIG. 4b: an optical microscopic photograph of an organic mold fabricated using the mastermold of FIG. 4a.

DETAILED DESCRIPTION OF THE INVENTION

Figure 1:
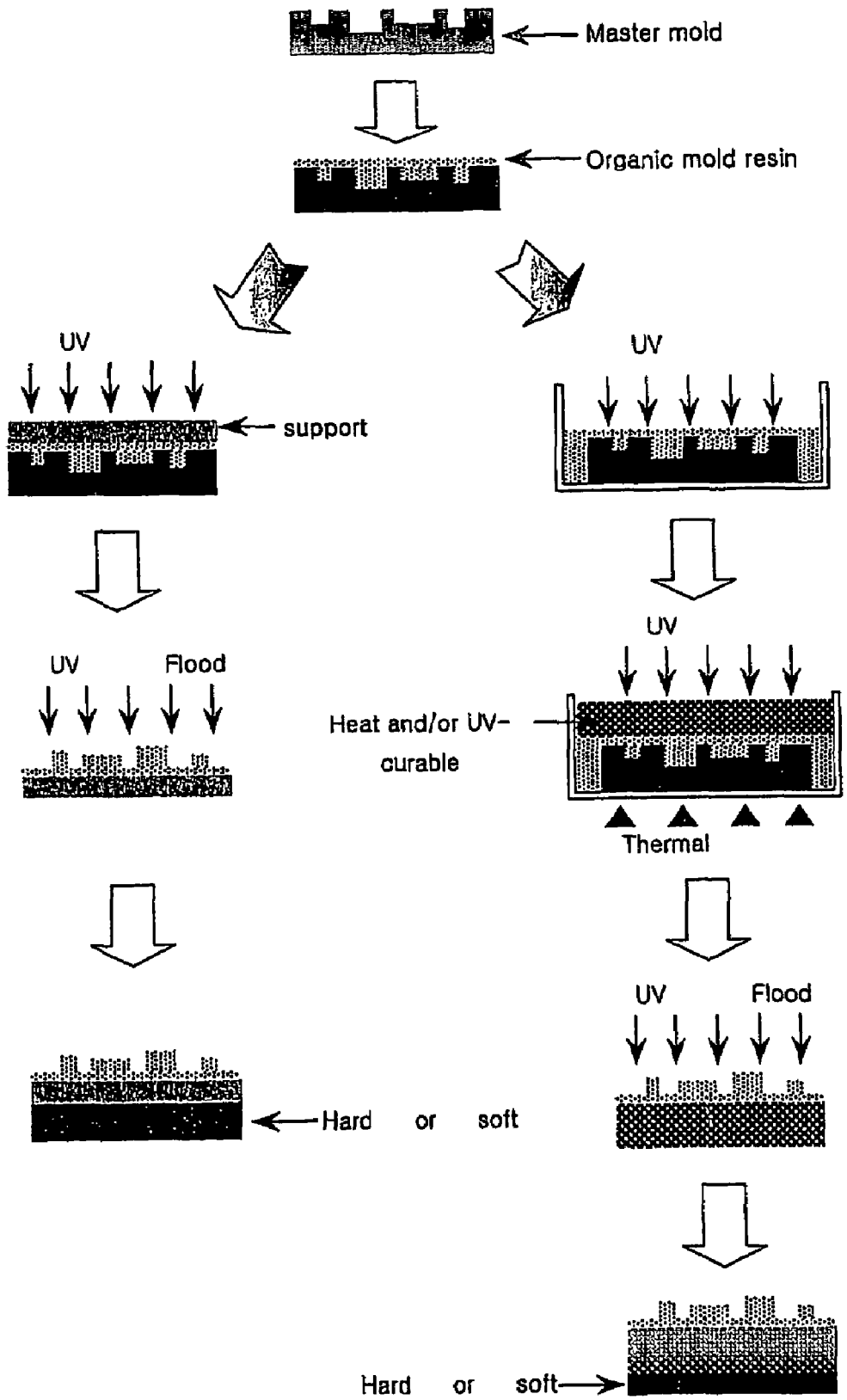
FIG. 1: a schematic view showing the procedure for preparing a mold using a resin composition according to the present invention.

The present invention provides a resin composition for an organic mold to be used in forming micro-patterns, preferably submicro-patterns, and a method for fabricating the organic mold using said composition and the mold fabricated thereby.

The inventive resin composition is characterized by comprising an energy-curable components simultaneously having a hard segment such as cycloaliphatic or aromatic ring and a soft segment such as a linear aliphatic long chain, which makes it possible to form micropatterns and to impart the flexibility to a mold, and a silicon or fluorine containing compound which can provide a mold with an excellent releasing property while maintaining good physical properties of the mold. The compactness, i.e., the degree of cross-linkage in the molecular structure of the mold, may be enhanced by adjusting the total amount of the reactive groups present in the composition.

Herein, the term "(meth)acrylate" is meant to represent acrylate and methacrylate, and the term "active energy ray" is meant to be an ultraviolet ray, infrared ray or electronic beam.

Specifically, the inventive resin composition comprises an active energy ray-curable urethane-based oligomer ("Component A") for imparting a high elasticity and bendability to the composition. The active energy curable urethane-based oligomer may be a linear aliphatic, cycloaliphatic or aromatic urethane-based oligomer having at least two reactive groups, and a mixture thereof.

The urethane-based oligomer may be used in an amount of 40 to 90 parts by weight in the inventive composition. When the amount is less than the lower limit, the mechanical strength of a mold obtained from the composition becomes inferior, while when the amount exceeds the upper limit, the mold becomes too brittle.

The urethane-based oligomer may be partially substituted by a reactive oligomer for enhancing the physical properties such as flexibility, surface hardness, abrasive resistance, thermal resistance, weather resistance and chemical resistance of the composition. Such an optional oligomer may be a (meth)acrylated polyester, (meth)acrylated polyether, (meth)acrylated epoxy, (meth)acrylated polycarbonate, (meth)acrylated polybutadiene, or a mixture thereof, and may be employed in an amount of 0 to 200% by weight of the urethane-based oligomer.

In the present invention, a monomer having the reactivity with the urethane-based oligomer ("Component B") is employed as a reactive diluent, and representative examples thereof include (meth)acrylates such as isobornyl acrylate, 1,6-hexanediol acrylate, triethyleneglycol di(meth)acrylate, trimethylol propane triacrylate, tetraethyleneglycol di(meth)acrylate, 1,3-butanediol diacrylate, 1,4-butanediol diacrylate, diethyleneglycol diacrylate, neopentylglycol diacrylate, neopentylglycol di(meth)acrylate, polyethyleneglycol di(meth)acrylate, pentaerythritol triacrylate, dipentaerythritol (hydroxy)pentaacrylate, alkoxylated tetraacrylate, octadecyl acrylate, isodecyl acrylate, lauryl acrylate, stearyl acrylate, behenyl acrylate, styrenic monomer, and a mixture thereof; and vinyl ethers and aryl ethers such as cyclohexyl vinyl ether, 2-ethylhexyl vinyl ether, dodecyl vinyl ether, aryl propyl ether, aryl butyl ether, 1,4-butanediol divinyl ether, 1,4-hexanediol divinyl ether, diethylene glycol divinyl ether, ethyleneglycol butyl vinyl ether, ethyleneglycol divinyl ether, triethyleneglycol methylvinyl ether, triethyleneglycol divinyl ether, trimethylol propane trivinyl ether, pentaerythritol triary ether, 1,4-cyclohexane dimethanol divinyl ether, and a mixture thereof.

The reactive diluent can control the cross-linking density of the composition to impart a good flexibility to the composition, and it may be used in an amount of 10 to 60 parts by weight in the composition.

In addition, the resin composition of the present invention comprises a silicone or fluorine group-containing compound ("Component C") as a functionalized additive. Component C has at least one silicon or fluorine group, and representative examples thereof include (i) a reactive monomer or oligomer having a silicone group, e.g., a silicone-containing vinyl derivative, silicone-containing (meth)acrylate, (meth)acryloxy-containing organosiloxane, or silicone polyacrylate; (ii) a reactive monomer or oligomer having a fluorine group, e.g., a fluoroalkyl-containing vinyl derivative, fluoroalkyl-containing (meth)acrylate, or fluorine polyacrylate; (iii) a silicone or fluorine containing resin, e.g., an organopolysiloxane, and a fluorinated polymer; and (iv) a silicone or fluorine containing surfactant or oil, e.g., a dimethyl silicone oil; and a mixture thereof.

The functionalized additive can provide a mold with a good releasing property, and it may be used in an amount of 5 to 200 parts by weight, in case of the ingredients (i) to (iii), and in an amount of 0.01 to 5 parts by weight, in case of the ingredient (iv), based on 100 parts of the total amount of Components A and B used.

The photo-initiator ("Component D") used in the composition of the present invention may be a conventional free radical initiator or cationic initiator, or a mixture thereof. Representative examples of the free radical initiator include benzyl ketals, benzoin ethers, acetophenone derivatives, ketoxime ethers, benzophenone, benzo and thioxantone compounds, and mixtures thereof, and the cationic initiator may be onium salts, ferrocenium salts, diazonium salts, and mixtures thereof. In case a vinyl ether compound is used as Component B, it is preferred to employ a suitable mixture of the free radical initiator and the cationic initiator.

The photo-initiator may be preferably employed in an amount of 0.1 to 10 parts by weight based on 100 parts of the total amount of Components A, B and C used.

The resin composition of the present invention can be cured with an active energy ray to provide an organic mold having a good releasability, low swelling in solvent, good conformity to a substrate, and high mechanical strength. Further, the inventive resin composition can provide a mold having a large size in a simple process at a low production cost, and therefore, it can be utilized for the mass production of an organic mold.

The resulting organic mold can be beneficially used in forming an ultramicro- or submicro-pattern having a line width of below several ten nm. The formation of micropatterns using the inventive organic mold can be conducted by any replicating method known in the art, e.g., nano-imprint lithography, micro-contact printing (mCP), micro-molding in capillaries (MIMIC), micro-transfer molding (mTM), soft molding, and capillary force lithography (CFL).

FIG. 1 shows a schematic view of the procedure for preparing a mold using a resin composition according to the present invention. Specifically, as shown in the procedure (a), the inventive resin composition is coated or cast on a pattern face of a mastermold, and a support for the mold is covered thereon. The resulting laminate is irradiated with an active energy ray such as a UV light to preliminarily cure the resin composition. The cured organic mold having a pattern face reverse to that of the mastermold is removed from the mastermold, and further UV-cured until the remaining reactive group in the resin is completely consumed, to enhance the hardness of the organic mold. The support for the mold may be preferably made of a polymer such as polyethylene terephthalate(PET), polycarbonate(PC), polyvinyl chloride(PVC), a soft or rigid elastomer, and others. The organic mold thus fabricated may be further adhered to or combined with a soft elastic or hard polymer backing having a desired shape and thickness, depending on the final use of the mold. The baking may be made of an epoxy resin, urethane elastomer, butadiene-based rubber, or a mixture thereof.

Alternatively, according to the procedure (b) of FIG. 1, a mastermold is firstly coated or cast with the resin composition of the present invention as in the (a) procedure and pseudo-cured with an UV light, and thereto an UV-curable or heat-curable resin composition as a backbone material is poured to a desired thickness in a vessel and completely cured. The cured organic mold is removed from the mastermold. The heat or UV curable backbone resin may be a conventional soft or rigid polymeric material selected from an epoxy resin, urethane elastomer, butadiene-based rubber, and a mixture thereof, depending on the final use of the mold.

The present invention will be described in further detail by the following Examples, which are, however, not intended to limit the scopes of the present invention.

Preparations 1 to 5

Mold compositions having the composition shown in Table 1 were prepared.

The cured organic mold was lifted off from the mastermold to obtain an organic mold having the desired pattern combined with a polyethylene terephthalate (PET) support. Then, UV (5 mJ/cm$^2$) was additionally irradiated for 2 hours to completely cure the organic mold

EXAMPLE 1-2

A replicated organic mold was fabricated as shown in the procedure (b) of FIG. 1.

Specifically, the pattern surface of the silicon mastermold used in Example 1-1 is firstly coated with the resin composition of Preparation 1 to a thickness of 15 μm and pre-cured for 3 minutes with a UV light of 5 mJ/cm$^2$. The laminate was placed in a vessel, and a UV curable, acrylated butadiene resin composition was poured and cured to form a backbone layer to a thickness of 2 mm.

The cured product was removed from the vessel and an organic mold having the desired pattern with an acrylated butadiene backbone was lifted off from the mastermold, and then additionally irradiated with UV (5 mJ/cm$^2$) for 2 hours to completely cure the organic mold.

Figure 2A:
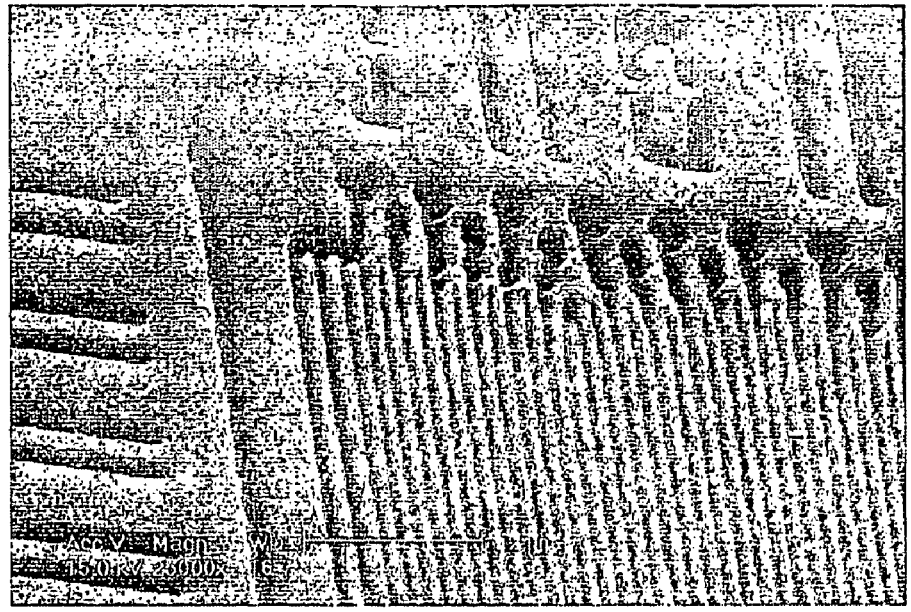
FIG. 2a: an electronic microscopic photograph of a mold having an equal line width and space of 80 nm fabricated by the inventive method.

FIG. 2a is an electronic microscopic photograph of an organic mold fabricated as in Example 1-1 which has an equal line width and space of 80 nm.

Figure 3A:
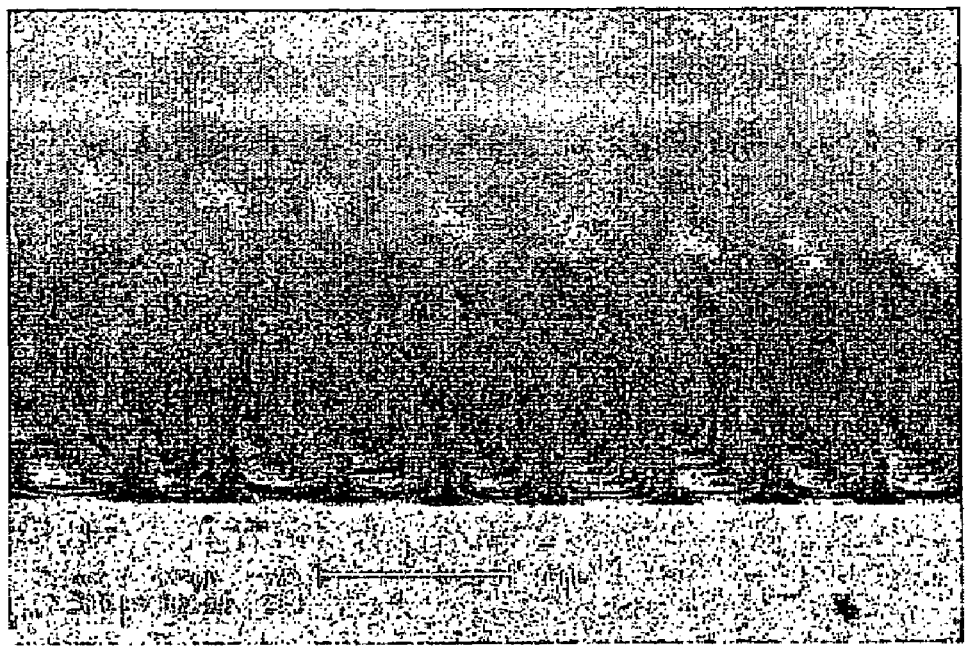
FIG. 3a: an electronic microscopic photograph of a mold having a cylindrical pattern fabricated by the inventive method.

Further, FIG. 3a is an electronic microscopic photograph of an organic mold having a cylindrical pattern, in which

TABLE 1

| Component | Ingredient | Prep. 1 | Prep. 2 | Prep. 3 | Prep. 4 | Prep. 5 |
|---|---|---|---|---|---|---|
| (A) Active energy curable urethane-based oligomer*[1] | Difunctional aliphatic urethane acrylate oligomer*[5] | 31.0 | 37.5 | 31.0 | 31.0 | 36.0 |
| | Difunctional cycloaliphatic urethane acrylate oligomer*[6] | 25.0 | — | 25.0 | 25.0 | 20.0 |
| | Trifunctional aliphatic urethane acrylate oligomer*[7] | 12.5 | 25.0 | 12.5 | 12.5 | 27.5 |
| | Trifunctional cycloaliphatic urethane acrylate oligomer*[8] | — | 12.5 | — | — | — |
| | Hexafunctional aliphatic urethane acrylate oligomer*[9] | 6.5 | — | 6.5 | 6.5 | 11.5 |
| (B) Reactive diluent*[2] | 1,6-hexanediol diacrylate | 12.5 | 12.5 | 12.5 | 12.5 | — |
| | Neopentylglycol diacrylate | 12.5 | — | 12.5 | 12.5 | 5.0 |
| | Trimethylol propane (propylated) 3 triacrylate | — | 12.5 | — | — | — |
| (C) Functionalized additive*[3] | (3-acryloylpropyl)-tris(trimethylsiloxy)silane | 12.5 | 12.5 | — | — | — |
| | Silicone polyacrylate | 12.5 | — | — | — | — |
| | 2,2,2-trifluoroethyl methacrylate | — | 12.5 | — | — | — |
| | Dimethyl silicone oil (100 centistokes) | — | — | 1.0 | — | 1.0 |
| (D) Free Radical Photoinitiator*[4] | 1-hydroxycyclohexyl phenyl ketone | 2.5 | 2.5 | 2.5 | 2.5 | 2.5 |
| | Methyl benzoyl formate | 1.5 | 1.5 | 1.5 | 1.5 | 1.5 |

Footnote:
*[1], *[2]part by weight
*[3]parts by weight based on the sum of Components A and B
*[4]parts by weight based on the sum of Components A, B and C
*[5]a urethane reaction product of hydroxypropyl acrylate and hexamethylene diisocyanate at an equivalent ratio of 2:1
*[6]a urethane reaction product of hydroxypropyl acrylate and 4,4-dicyclohexylmethane diisocyanate at an equivalent ratio of 2:1
*[7]a urethane reaction product of hydroxypropyl acrylate and a trifuctional triisocyanate having a structure of isocyanurate of hexamethylene diisocyanate, at an equivalent ratio of 3:1
*[8]a urethane reaction product of hydroxypropyl acrylate and a trifuctional triisocyanate having a structure of isocyanurate of isoporone diisocyanate, at an equivalent ratio of 3:1
*[9]a urethane reaction product of pentaerythritol propoxylate triacrylate and hexamethylene diisocyanate at an equivalent ratio of 2:1

EXAMPLE 1-1

An organic mold was fabricated by a replicating method as shown in the procedure (a) of FIG. 1.

Specifically, a silicon mastermold having the reverse pattern structure of a desired resin pattern was prepared. A resin composition according to Preparation 1 was coated on the pattern face of the mastermold to a thickness of 15 μm. Then, a transparent adhesive polyethylene terephthalate sheet having a thickness of 188 μm was laid on the coated surface, and the resulting laminate was irradiated with a UV light of 5 mJ/cm$^2$ for 15 seconds to cure the resin composition.

cylindrical cavities having a 100 nm diameter and a 450 nm height were aligned in series, fabricated as in Example 1-1.

EXAMPLE 2-1

Figure 2B:
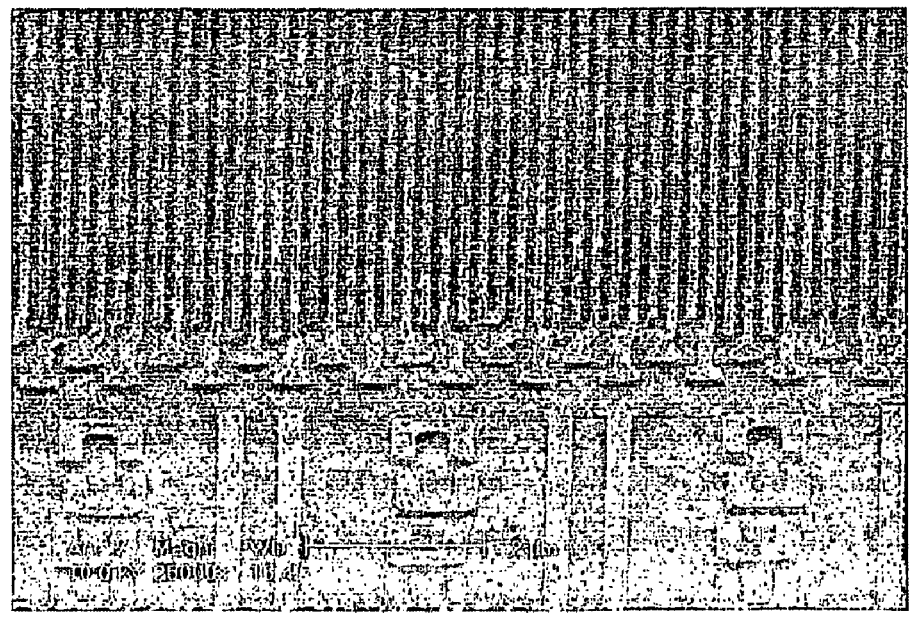

The organic mold shown in FIG. 2a was employed to form a pattern by a soft molding method. Specifically, a polystyrene resin solution was coated on a silicon wafer substrate and, on the coated resin layer, the mold was placed and slightly pressed to transfer the desired pattern on the polystyrene resin layer. FIG. 2b shows an electronic microscopic photograph of the pattern thus formed.

EXAMPLE 2-2

Figure 3B:

The organic mold shown in FIG. 3a was employed to form a pattern by UV flash replication method. Specifically, a UV-curable, acrylated epoxy resin solution was coated on a PET substrate, the prepared mold was placed on the coated epoxy resin layer, and then the resulting laminate was irradiated with UV to cure the epoxy resin composition. FIG. 3b is an electronic microscopic photograph of the pattern thus formed.

FIGS. 2b and 3b illustrate that the mold fabricated from the inventive resin composition can provide submicropatterns without the problem of adhesion or generating defects.

EXAMPLES 3 and 4

The procedure of Example 1-1 was repeated except for using the mold composition of Preparation 2 and 3 instead of the composition of Preparation 1, respectively, to fabricate organic molds, which were then used in forming patterns according to Example 2-1.

The organic molds thus fabricated and the patterns obtained therefrom have the same characteristics observed in FIGS. 2a and 3a, and 2b and 3b, respectively.

COMPARATIVE EXAMPLE 1

The procedure of Example 1-1 was repeated except that the resin composition of Preparation 4 which contains no functionalized additive, and a silicon mastermold having a pyramid pattern, in which pyramid shaped cavities having a bottom area of 180 μm×180 μm and a height of 70 μm were aligned in series, was used to fabricate an organic mold.

Figure 4A:
FIG. 4a: an optical microscopic photograph of a mastermold having a pyramid shaped pattern for use in fabricating a mold according to Comparative Example.
Figure 4B:
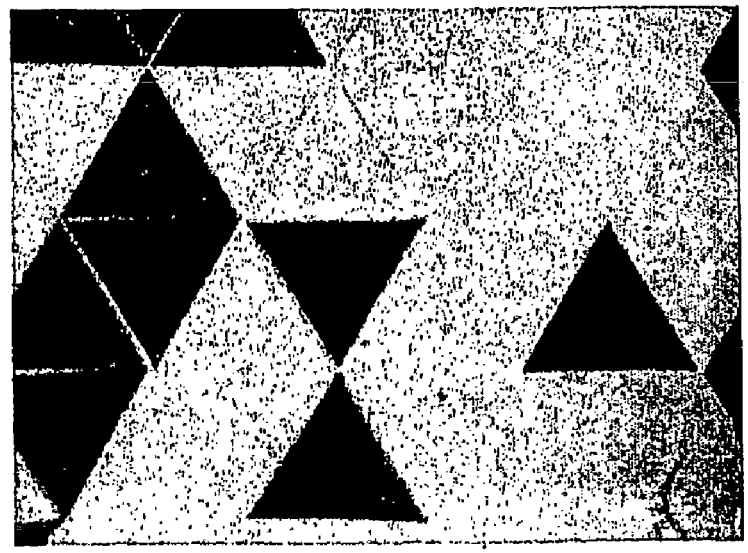

FIG. 4a is an optical microscopic photograph of the pyramid patterns-forming mastermold, and FIG. 4b is an optical microscopic photograph of an organic mold fabricated using the mastermold. By comparing FIG. 4a and FIG. 4b, it can be seen that the organic mold thus fabricated has several defects.

COMPARATIVE EXAMPLE 2

The procedure of Example 1-1 was repeated except that the organic mold composition of Preparation 5 comprising a smaller amount of a reactive diluent was used to fabricate an organic mold. The organic mold broke easily during the patterning step due to its high brittleness.

While the invention has been described with respect to the above specific examples, it should be recognized that various modifications and changes may be made to the invention by those skilled in the art which also fall within the scope of the invention as defined by the appended claims.

What is claimed is:

1. An organic mold for transferring micropatterns to a substrate, the organic mold having a reverse pattern face of the face of said micropatterns and being fabricated from a resin composition comprising:
    (A) 40 to 90 parts by weight of an active energy curable urethane-based oligomer having a reactive group selected from the group consisting of (meth)acrylate, vinylether, arylether, and a combination thereof;
    (B) 10 to 60 parts by weight of a monomer reactive with the urethane-based oligomer, having a reactive group selected from the group consisting of (meth)acrylate, vinylether, arylether, and a combination thereof;
    (C) 0.01 to 200 parts by weight of a silicone or fluorine containing compound, based on 100 parts of the sum of the components (A) and (B); and
    (D) 0.1 to 10 parts by weight of a photoinitiator, based on 100 parts of the sum of the components (A), (B) and (C),
    wherein the silicone- or fluorine-containing compound is at least one component selected from:
    (i) a silicone-containing reactive monomer or oligomer selected from the group consisting of a silicone-containing vinyl derivative, silicone-containing (meth)acrylate, (meth)acryloxy-containing organosiloxane silicone polyacrylate, and a mixture thereof;
    (ii) a fluorine-containing reactive monomer or oligomer selected from the group consisting of a fluoroalkyl-containing vinyl derivative, fluoroalkyl-containing (meth)acrylate, fluorine polyacrylate, and a mixture thereof; and
    (iii) a combination of (i) and (ii).

2. The organic mold according to claim 1, wherein the active energy curable urethane-based oligomer used in the resin composition is selected from the group consisting of linear aliphatic, cycloaliphatic and aromatic urethane-based oligomers having at least two reactive groups, and a mixture thereof.

3. The organic mold according to claim 1, wherein the resin composition further comprises at least one reactive oligomer selected from the group consisting of a (meth)acrylated polyester, (meth)acrylated polyether, (meth)acrylated epoxy, (meth)acrylated polycarbonate, (meth)acrylated butadiene, and a mixture thereof, as a partial substituent of Component A.

4. The organic mold according to claim 1, wherein the (meth)acrylate used as Component B in the resin composition is selected from the group consisting of isobornyl acrylate, 1,6- hexanediol acrylate, triethyleneglycol di(meth)acrylate, trimethylol propane triacrylate, tetraethyleneglycol di(meth)acrylate, 1,3-butanediol diacrylate, 1,4-butanediol diacrylate, diethyleneglycol diacrylate, neopentylglycol diacrylate, neopentylglycol di(meth)acrylate, polyethyleneglycol di(meth)acrylate pentaerythritol triacrylate, dipentaerythritol (hydroxy) pentaacrylate, alkoxylated tetraacrylate, octadecyl acrylate, isodecyl acrylate, lauryl acrylate, stearyl acrylate, behenyl acrylate, styrenic monomer, and a mixture thereof.

5. The organic mold according to claim 1, wherein the vinyl ether used as Component B in the resin composition is selected from the group consisting of cyclohexyl vinyl ether, 2-ethylhexyl vinyl ether, dodecyl vinyl ether, 1,4-butanediol divinyl ether, 1,4 hexanediol divinyl ether, diethylene glycol divinyl ether, ethyleneglycol buty vinyl ether, ethyleneglycol divinyl ether, triethyleneglycol methylvinyl ether triethyleneglycol divinyl ether, trimethylol propane trivinyl ether, 1,4 cyclohexane dimethanol divinyl ether, and a mixture thereof.

6. The organic mold according to claim 1, wherein the aryl ether used as Component B in the resin composition is selected from the group consisting of aryl propyl ether, ary butyl ether, pentaerythritol triary ether, and a mixture thereof.

7. The organic mold according to claim 1, wherein the photoinitiator used in the resin composition is a free radical initiator selected from the group consisting of benzyl ketals, benzoin ethers, acetophenone derivatives, ketoxime ethers, benzophenone, benzo and thioxantone compounds, and mixtures thereof, and a cationic initiator selected from the group consisting of onium salts, ferrocenium salts, diazonium salts, and mixtures thereof.

8. A method for fabricating an organic mold, which comprises coating or casting a resin composition for the organic mold on a pattern face of a mastermold, placing a support on the resin layer, irradiating the resulting laminate with an active energy ray to preliminarily cure the resin composition, lifting off the organic mold having a reverse pattern face to that of the mastermold and integrally formed with the support from the mastermold, and completely curing the organic mold wherein the resin composition comprises:

(A) 40 to 90 parts by weight of an active energy curable urethane- based oligomer having a reactive group selected from the group consisting of (meth)acrylate, vinylether, arylether, and a combination thereof;

(B) 10 to 60 parts by weight of a monomer reactive with the urethane-based oligomer, having a reactive group selected from the group consisting of (meth)acrylate, vinylether, arylether, and a combination thereof; and (C) 0.01 to 200 parts by weight of a silicone or fluorine containing compound, based on 100 parts of the sum of the components (A) and (B); and (D) 0.1 to 10 parts by weight of a photoinitiator, based on 100 parts of the sum of the components (A), (B) and (C);

wherein the silicone- or fluorine-containing compound is at least one component selected from:

(i) a silicone-containing reactive monomer or oligomer selected from the group consisting of a silicone-containing vinyl derivative, silicone-containing (meth)acrylate, (meth)acryloxy-containing organosiloxane silicone polyacrylate, and a mixture thereof;

(ii) a fluorine-containing reactive monomer or oligomer selected from the group consisting of a fluoroalkyl-containing vinyl derivative, fluoroalkyl-containing (meth)acrylate, fluorine polyacrylate, and a mixture thereof; and (iii) a combination of (i) and (ii).

9. The method according to claim 8, which further comprises adhering a soft or rigid backing having a curved or flat face to the bottom face of the organic mold.

10. A method for fabricating an organic mold, which comprises coating or casting a resin composition for the organic mold on a pattern face of a mastermold, irradiating the resin layer with an active energy ray to preliminarily cure it, pouring a UV- or heat-curable resin composition onto the cured resin layer as a backbone, heating or irradiating the resultant to completely cure the resin and the backbone layers, lifting off the organic mold having a reverse pattern face to that of the mastermold and integrally formed with the backbone layer from the mastermold, and completely curing the organic mold wherein the resin composition comprises:

(A) 40 to 90 parts by weight of an active energy curable urethane- based oligomer having a reactive group selected from the group consisting of (meth)acrylate, vinylether, arylether, and a combination thereof;

(B) 10 to 60 parts by weight of a monomer reactive with the urethane-based oligomer, having a reactive group selected from the group consisting of (meth)acrylate, vinylether, arylether, and a combination thereof;

(C) 0.01 to 200 parts by weight of a silicone or fluorine containing compound, based on 100 parts of the sum of the components (A) and (B) and (D) 0.1 to 10 parts by weight of a photoinitiator, based on 100 parts of the sum of the components (A), (B) and (C);

wherein the silicone- or fluorine-containing compound is at least one component selected from:

(i) a silicone-containing reactive monomer or oligomer selected from the group consisting of a silicone-containing vinyl derivative, silicone-containing (meth)acrylate, (meth)acryloxy-containing organosiloxane silicone polyacrylate, and a mixture thereof;

(ii) a fluorine-containing reactive monomer or oligomer selected from the group consisting of a fluoroalkyl-containing vinyl derivative, fluoroalkyl-containing (meth)acrylate, fluorine polyacrylate, and a mixture thereof; and (iii) a combination of (i) and (ii).

* * * * *

UNITED STATES PATENT AND TRADEMARK OFFICE
CERTIFICATE OF CORRECTION

PATENT NO. : 7,655,307 B2
APPLICATION NO. : 10/553647
DATED : February 2, 2010
INVENTOR(S) : Kim et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 952 days.

Signed and Sealed this

Twenty-eighth Day of December, 2010

David J. Kappos
*Director of the United States Patent and Trademark Office*